United States Patent
Hanashima

(10) Patent No.: US 10,295,716 B2
(45) Date of Patent: May 21, 2019

(54) INORGANIC POLARIZING PLATE AND PRODUCTION METHOD THEREOF

(71) Applicant: DEXERIALS CORPORATION, Shinagawa-ku, Tokyo (JP)

(72) Inventor: Naoki Hanashima, Tokyo (JP)

(73) Assignee: DEXERIALS CORPORATION, Shinagawa-Ku, Tokyo (JP)

( * ) Notice: Subject to any disclaimer, the term of this patent is extended or adjusted under 35 U.S.C. 154(b) by 0 days.

(21) Appl. No.: 14/709,862

(22) Filed: May 12, 2015

(65) Prior Publication Data

US 2015/0331166 A1    Nov. 19, 2015

(30) Foreign Application Priority Data

May 15, 2014    (JP) ................. 2014-101635

(51) Int. Cl.
 *G02B 5/30*      (2006.01)
 *C23C 16/44*     (2006.01)
 *C23C 16/455*    (2006.01)

(52) U.S. Cl.
 CPC ............ *G02B 5/3058* (2013.01); *C23C 16/44* (2013.01); *C23C 16/45525* (2013.01)

(58) Field of Classification Search
 CPC .......... G02B 5/00; G02B 5/30; G02B 5/3058; G02B 5/3025; G02F 1/00; G02F 1/133528; G02F 2001/133548
 (Continued)

(56) References Cited

U.S. PATENT DOCUMENTS 6,122,103 A    9/2000  Perkins et al.
2007/0242187 A1  10/2007  Yamaki et al.
(Continued)

FOREIGN PATENT DOCUMENTS

CN    1952700 A    4/2007
EP    1 775 607 A1    4/2007
(Continued)

OTHER PUBLICATIONS

Notice of Reasons for Rejection issued by the Japanese Patent Office in corresponding Japanese Patent Application No. 2014-101635 dated Apr. 5, 2016 (6 pages including partial English translation).

(Continued)

*Primary Examiner* — Robert E. Tallman
(74) *Attorney, Agent, or Firm* — Buchanan, Ingersoll & Rooney PC

(57) ABSTRACT

An inorganic polarizing plate, containing: substrate transparent to light of bandwidth for use; and wire grid layer containing metal wires aligned on the substrate with gaps shorter than wavelength of the light, the plate satisfying formulae (1) to (3):

$0\ nm < (D_R - D_L)$   Formula (1);

$0\ nm < |G_R - G_L|$   Formula (2); and $0.90 \leq S_R/S_L \leq 1.30$   Formula (3), where $D_L$ is distance along thickness direction of the substrate in region $R_L$ between one metal wire W and metal wire $W_L$ next to W in the wire grid layer, and $D_R$ is distance along the thickness direction of the substrate in region $R_R$ between W and metal wire $W_R$ provided next to W and at opposite side to side where $W_L$ is provided; $G_L$ is gap between W and $W_L$, and $G_R$ is gap between W and $W_R$; and $S_L$ is ratio of $D_L$ to $G_L$, and $S_R$ is ratio of $D_R$ to $G_R$.

10 Claims, 7 Drawing Sheets

(58) Field of Classification Search
USPC ............ 359/458.01, 485.03, 485.04, 485.05, 359/483.01
See application file for complete search history.

(56) References Cited

U.S. PATENT DOCUMENTS

| | | |
|---|---|---|
| 2008/0055723 A1 | 3/2008 | Gardner et al. |
| 2008/0278811 A1 | 11/2008 | Perkins et al. |
| 2008/0316599 A1 | 12/2008 | Wang et al. |
| 2010/0075503 A1 | 3/2010 | Bencher et al. |
| 2011/0250757 A1 | 10/2011 | Sukekawa et al. |
| 2011/0286094 A1 | 11/2011 | Kaida et al. |
| 2012/0250154 A1* | 10/2012 | Davis .................. B82Y 20/00 359/485.05 |
| 2012/0319222 A1 | 12/2012 | Ozawa et al. |
| 2014/0016197 A1 | 1/2014 | Davis |
| 2014/0026398 A1 | 1/2014 | Watanabe et al. |

FOREIGN PATENT DOCUMENTS

| | | |
|---|---|---|
| JP | 2003-502708 A | 1/2003 |
| JP | 2007-310250 A | 11/2007 |
| JP | 2008-083657 A | 4/2008 |
| JP | 2010-114424 A | 5/2010 |
| JP | 2010-117646 A | 5/2010 |
| JP | 4763099 B2 | 8/2010 |
| JP | 2010-204626 A | 9/2010 |
| JP | 2010-530994 A | 9/2010 |
| JP | 2010-530995 A | 9/2010 |
| JP | 2010-531467 A | 9/2010 |
| JP | 4800437 B2 | 10/2011 |
| JP | 2011-233878 A | 11/2011 |
| JP | 2012-080065 A | 4/2012 |
| JP | 2012-169408 A | 9/2012 |
| JP | 2012-227130 A | 11/2012 |
| WO | WO 2013/032570 A1 | 3/2013 |

OTHER PUBLICATIONS

Notice of Reasons for Rejection issued by the Japanese Patent Office in corresponding Japanese Patent Application No. 2014-101635 dated Aug. 2, 2016 (8 pages including partial English translation).

Office Action dated May 31, 2018, by the State Intellectual Property Office of People's Republic of China in corresponding Chinese Patent Application No. 201510251169.9 and an English Translation of the Office Action. (11 pages).

Appeal Decision dated Jun. 5, 2018, by the Japanese Patent Office in corresponding Japanese Patent Application No. 2014-101635. (22 pages).

* cited by examiner

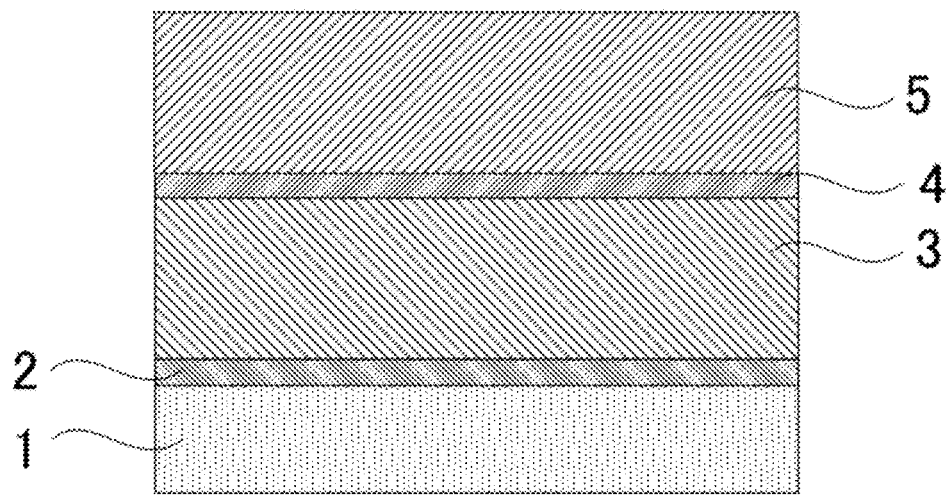
FIG. 2C
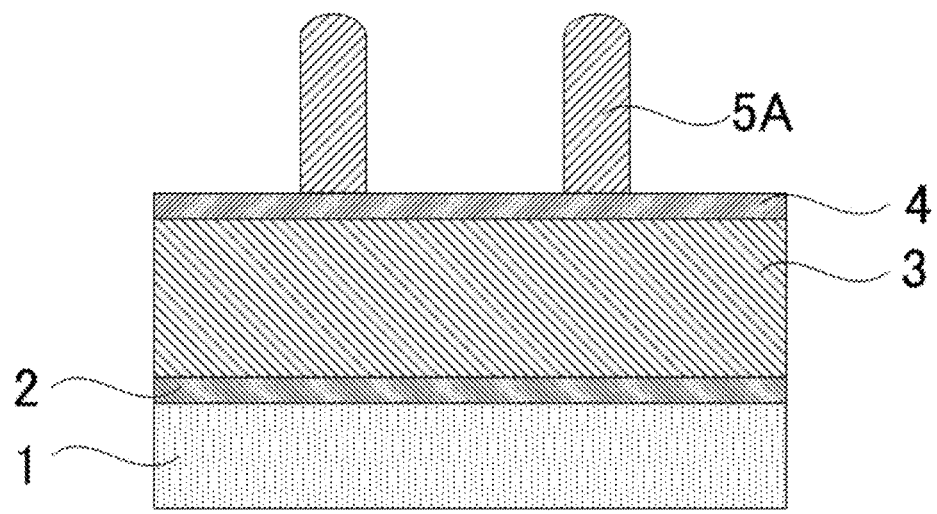
DIG. 2D

INORGANIC POLARIZING PLATE AND PRODUCTION METHOD THEREOF

BACKGROUND OF THE INVENTION

Field of the Invention

The present invention relates to an inorganic polarizing plate, and a production method thereof.

Description of the Related Art

A polarizing plate, which is configured to polarize light in a certain direction, and only pass the polarized light through, is used in a liquid crystal display.

As for the polarizing plate, a polarizing film, which is prepared by adsorbing an iodine compound on a polyvinyl alcohol (PVA) film, and stretching and orientating the resultant, to thereby exhibit absorption linear dichroism of visible light, has been widely used. Both sides of this polarizing film are sandwiched with transparent films, such as triacetyl cellulose (TAC) to secure mechanical strength, heat resistance, and moisture resistance, and a hard coat treatment is performed thereon to prevent scratches, or depositions of dusts.

Among light incident to the polarizing film, a polarizing component of the light, which is not passed through the polarizing film, is absorbed in the polarizing film, and released outside the polarizing film as heat. In the case where strong light is applied, therefore, the temperature of the polarizing film is increased by the generated heat, to thereby deteriorate the polarizing properties. This is due to heat resistance of the organic material itself, and thus it is difficult to fundamentally solve this problem.

Therefore, a wire grid polarizing plate composed only of inorganic materials has been considered as a polarizing plate usable in an environment where high heat resistance is required. The wire grid polarizing plate has a structure where a wire grid formed of fine metal wires having a frequency equal to or lower than a wavelength of light is formed on a surface of a substrate (see, for example, Japanese Patent Application Laid-Open (JP-A) Nos. 2010-204626, and 2010-117646).

The wire grid polarizing plate causes a phenomenon called "Rayleigh resonance" associated with a pitch (frequency) of the metal wires, because of the principle thereof. The properties of the wire grid polarizing plate significantly change at adjacent to the resonance wavelength, to thereby degrade the properties as a polarizer. The resonance wavelength is determined by the following formula:

$$\lambda_R = \frac{p(n_{e\!f\!f} \pm \sin\theta)}{k} \cong p n_{e\!f\!f}$$

In the formula above, $\lambda_R$ is a resonance wavelength, p is a pitch of metal wires, $n_{e\!f\!f}$ is an effective refractive index adjacent to the metal wires, θ is an incident angle, and k is diffraction order. Under the actual usage conditions, θ is typically 0°. The diffraction order indicates simple transmission at 0-degree (k=1), and a loss at the higher-degree diffraction at the first-degree (k>2), hence k=1 (right formula). Accordingly, the resonance wavelength of Rayleigh resonance is proportional to a pitch of the metal wires, and the effective refractive index adjacent to the metal wires. Moreover, the deterioration of the properties due to Rayleigh resonance can be prevented by largely sifting the resonance wavelength from wavelengths of a bandwidth for use.

In order to lower the effective refractive index adjacent to the metal wires, to shorten the resonance wavelength of Rayleigh resonance in a polarizing plate, proposed is a method where a region between the metal wires having a low refractive index is increased along a thickness direction of a substrate to lower the effective refractive index (see, for example, JP-A Nos. 2003-502708, 2010-530994, and 2010-530995, and Japanese Patent (JP-B) Nos. 4763099 and 4800437).

Moreover, it is effective to narrow a pick between the metal wires, in order to shorten the resonance wavelength ($\lambda_R$) in the formula above. An effect of shortening a resonance wavelength is lager especially with narrowed pitch of metal wire than reduction in the effective refractive index, as it can be changed at a lager ratio.

As for a production of the wire grid, conventionally, a method, such as interference exposure, has been used. In order to narrow a pick between metal wires in the interference exposure, it is necessary to shorten a wavelength of light emitted from a laser light source, used as exposure light. However, there is a problem that there is no light source actually used, as it is attempt to make a pitch between metal wires 100 nm.

SUMMARY OF THE INVENTION

In the cutting-edge lithography technique for semiconductors, a development of a process, which is an effective process for narrowing a pitch, is called "double patterning", and halves a pitch of a mask pattern, has been conducted.

In this process, two regions present both sides of a line formed by the patterning may have different depths, as the processing methods are different.

The present inventors have studied a production of an inorganic polarizing plate through double patterning, and have found a problem that the Rayleigh resonance is caused due to a difference in depth of two region present both sides of a metal wire in a wire grid layer, as described above, namely the Rayleigh resonance is caused by asymmetry. The Rayleigh resonance degrades transmission properties of the inorganic polarizing plate.

The present invention aims to solve a newly discovered problem from the insight of the present inventors, and to achieve the following object. Specifically, an object of the present invention is to provide an inorganic polarizing plate, which can prevent reduction in transmittance caused by Layleight resonance due to asymmetric shapes of two regions at both sides of a metal wire in a wire grid layer, and to provide a production method thereof.

The means for solving the aforementioned problems are as follows:

<1> An inorganic polarizing plate, containing:

a substrate, which is transparent to light of a bandwidth for use; and a wire grid layer containing a plurality of metal wires aligned on the substrate with gaps shorter than a wavelength of the light, wherein the inorganic polarizing plate satisfies the following formulae (1) to (3):

$$0 \text{ nm} < (D_R - D_L) \qquad \text{Formula (1);}$$

$$0 \text{ nm} < |G_R - G_L| \qquad \text{Formula (2); and}$$

$$0.90 \le S_R/S_L \le 1.30 \qquad \text{Formula (3),}$$

where $D_L$ is a distance along a thickness direction of the substrate in a region $R_L$ between one metal wire W and a metal wire $W_L$ provided next to the metal wire W in the wire grid layer, and $D_R$ is a distance along the thickness direction of the substrate in a region $R_R$ between the metal wire W and a metal wire $W_R$ provided next to the metal wire W and at an opposite side to a side where the metal wire $W_L$ is provided, where $G_L$ is a gap between the metal wire W and the metal wire $W_L$, and $G_R$ is a gap between the metal wire W and the metal wire $W_R$, and where $S_L$ is a ratio of the distance $D_L$ to the gap $G_L$, and $S_R$ is a ratio of the distance $D_R$ to the gap $G_R$.

<2> The inorganic polarizing plate according to <1>, wherein the distance $D_L$ and the distance $D_R$ satisfy the following formula (1-2), and the gap $G_L$ and the gap $G_R$ satisfy the following formula (2-2):

$$0\ nm<(D_R-D_L) \leq 8\ nm \qquad \text{Formula (1-2); and}$$

$$0\ nm<|G_R-G_L| \leq 20\ nm \qquad \text{Formula (2-2).}$$

<3> The inorganic polarizing plate according to <1> or <2>, wherein the substrate is glass.

<4> The inorganic polarizing plate according to any one of <1> to <3>, wherein the metal wire contains Al or an AlSi alloy.

<5> The inorganic polarizing plate according to any one of <1> to <4>, further containing a $SiO_2$ layer between the substrate and the wire grid layer.

<6> A production method of an inorganic polarizing plate, containing:

forming a wire grid layer through double patterning using a coverage film, wherein the production method is a method for producing the inorganic polarizing plate according to any one of <1> to <5>.

<7> The production method according to <6>, wherein the coverage film used for the double patterning is an $Al_2O_3$ film or a $SiO_2$ film.

<8> The production method according to <6> or <7>, wherein the coverage film used for the double patterning is formed by atomic layer deposition or chemical vapor deposition.

The present invention can solve the aforementioned various problems in the art, achieve the aforementioned object, and provide an inorganic polarizing plate, which can prevent reduction in transmittance caused by Layleight resonance due to asymmetric shapes of two regions at both sides of a metal wire in a wire grid layer, and provide a production method thereof.

BRIEF DESCRIPTION OF THE DRAWINGS

FIG. 2C is a schematic cross-sectional view explaining one example of a step where a wire grid layer is formed through double patterning using a coverage film (part 3).

FIG. 2D is a schematic cross-sectional view explaining one example of a step where a wire grid layer is formed through double patterning using a coverage film (part 4).

DETAILED DESCRIPTION OF THE INVENTION

Inorganic Polarizing Plate

Figure 1:
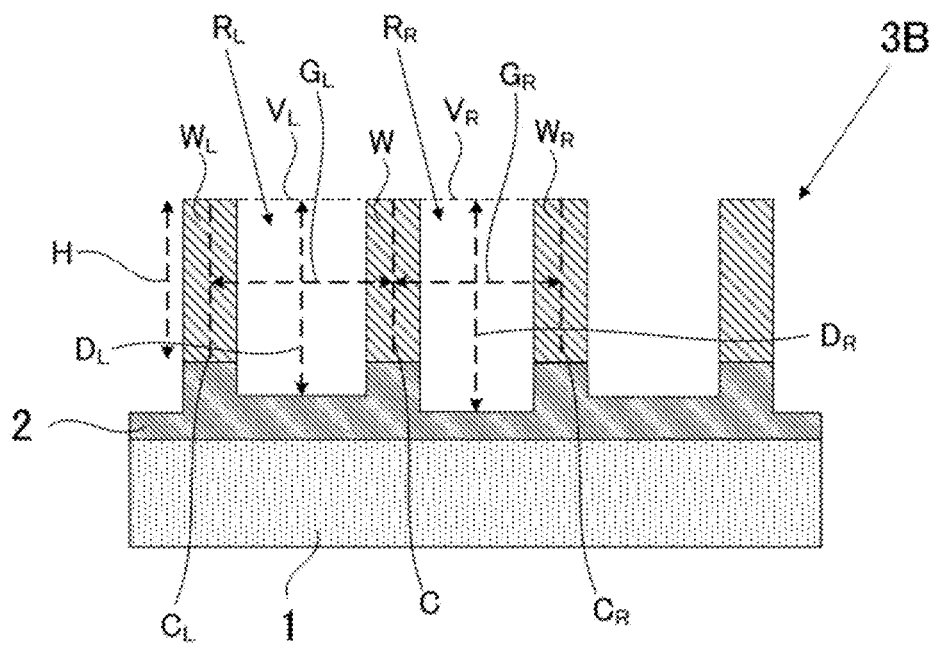
FIG. 1 is a schematic cross-sectional view illustrating one example of the inorganic polarizing plate of the present invention.

The inorganic polarizing plate of the present invention contains at least a substrate, and a wire grid layer, and may further contain other members, such as a metal oxide layer, and a metal layer, as necessary.

<Wire Grid Layer>

The wire grid layer contains a plurality of metal wires aligned on the substrate with gaps shorter than a wavelength of the light.

The wire grid layer may be in contact with the substrate, or the metal oxide layer, or the meal layer may be provided between the wire grid layer and the substrate.

A distance $D_L$ and a distance $D_R$ satisfy the following formula (1), where $D_L$ is a distance along a thickness direction of the substrate in a region $R_I$ between one metal wire W and a metal wire $W_L$ provided next to the metal wire W in the wire grid layer, and $D_R$ is a distance along the thickness direction of the substrate in a region $R_R$ between the metal wire W and a metal wire $W_R$ provided next to the metal wire W and at an opposite side to a side where the metal wire $W_L$ is provided.

A gap $G_L$ and a gap $G_R$ satisfy the following formula (2), where $G_L$ is a gap between the metal wire W and the metal wire $W_L$, and $G_R$ is a gap between the metal wire W and the metal wire $W_R$.

Moreover, a ratio $S_L$ and a ratio $S_R$ satisfy the following formula (3), where $S_L$ is a ratio of the distance $D_L$ to the gap $G_L$, and $S_R$ is a ratio of the distance $D_R$ to the gap $G_R$.

$$0\ nm<(D_R-D_L) \qquad \text{Formula (1)}$$

$$0\ nm<|G_R-G_L| \qquad \text{Formula (2)}$$

$$0.90 \leq S_R/S_L \leq 1.30 \qquad \text{Formula (3)}$$

The ratio $S_L$ is $D_L/G_L$, and the ratio $S_R$ is $D_R/G_R$.

Note that, whichever metal wires provided both sides of the metal wire W is determined as a metal wire $W_L$ or a metal wire $W_R$ is determined so that the distance $D_R$ and the distance $D_L$ satisfy the formula (1) above.

In the present invention, Rayleigh resonance caused by asymmetric two regions can be prevented by setting the ratio ($S_L$) and the ratio ($S_R$) of the two regions to the similar, i.e., satisfying the formula (3), even when the two regions present at both sides of the metal wire of the wire grid layer are asymmetric, i.e., the formulae (1) and (2) are satisfied. Specifically, a reduction in the transmittance can be suppressed to 0.5% or less, when a relationship between the wavelength and the transmittance is measured. Note that, deterioration in transmittance properties due to the Rayleigh resonance caused by asymmetry can be sufficiently prevented, when the reduction in the transmittance is 0.5% or less.

It is considered that the prevention of the Rayleigh resonance can be achieved by adjusting the effective refractive indexes adjacent both sides of the metal wire to the similar degrees.

The effective refractive index is an average refractive index of the medium in the region. When light is passed through a material formed of a mixture of fine media each having different refractive indexes, light travels in a manner as in a medium having the average refractive index, not at a refractive index of each medium in the mixture, if a wavelength of the light is sufficiently larger than the fine media.

The width of the metal wire, and gap of the metal wires in the wire grid layer for use in the present invention are sufficiently smaller than visible light, and sizes appropriately sufficiently applicable for the aforementioned mechanism.

The effective refractive index can be associated with an electrostatic capacity between metal wires. Strictly, the effective refractive index is considered from an electromagnetic field distribution adjacent to the metal wire. In the present invention, however, the effective refractive index can be simplified as long as it is sufficient to attain an effect of reducing the Rayleigh resonance. Specifically, the effective refractive index can be considered to relate an amount determined by [distance (D)/gap (G)] of the region where the electromagnetic field spreads to a pseudo-capacity between the metal wires.

Even in the case where depths or widths of two regions present both sides of an arbitrary metal wire (i.e. a gap between metal wires) are different, therefore, the two regions are symmetric in view of the effective refractive index, if the amounts determined by [distance (D)/gap (G)] of the two regions are similar degrees.

Accordingly, the effective refractive indexes adjacent to the metal wire in the regions both sides of the metal wire are similar degrees by satisfying the formula (3), to thereby prevent the Rayleigh resonance.

In the present invention, it is acceptable as long as relationships represented by the formulae (1) to (3) can be satisfied at arbitrary one position in the wire grid layer. Since the production method of the inorganic polarizing plate produces an inorganic polarizing plate at high accuracy, it is assumed that the formulae (1) to (3) are satisfied in the entire region of the wire grid layer, if the one position is measured, and the relationships represented by the formulae (1) to (3) are satisfied at the measured position.

It is preferred that the distance $D_L$ and the distance $D_R$ satisfy the following formula (1-2), and the gap $G_L$ and the gap $G_R$ satisfy the following formula (2-2), as a wider bandwidth of light can be polarized. Moreover, the gap $G_L$ and the gap $G_R$ more preferably satisfy the following formula (2-3).

$$0\text{ nm} < (D_R - D_L) \leq 8 \text{ nm} \qquad \text{Formula (1-2)}$$

$$0\text{ nm} < |G_R - G_L| \leq 20 \text{ nm} \qquad \text{Formula (2-2)}$$

$$0\text{ nm} < |G_R - G_L| \leq 10 \text{ nm} \qquad \text{Formula (2-3)}$$

The lower limit of the absolute value of a difference between the distance $D_L$ and the distance $D_R$ is appropriately selected depending on the intended purpose without any limitation, provided that it is greater than 0 nm. The lower limit thereof is preferably 1 nm or greater.

The lower limit of the absolute value of a difference between the gap $G_L$ and the gap $G_R$ is appropriately selected depending on the intended purpose without any limitation, provided that it is greater than 0 nm. The lower limit thereof is preferably 1 nm or greater.

The ratio $S_L$ of the distance $D_L$ to the gap $G_L$ and the ratio $S_R$ of the distance $D_R$ to the gap $G_R$ preferably satisfy the following formula (3-2).

$$1.00 \leq S_R/S_L \leq 1.30 \qquad \text{Formula (3-2)}$$

A material, shape, and size of the metal wires are appropriately selected depending on the intended purpose without any limitation.

Examples of the material of the metal wires include Al, and an Al alloy. Examples of the Al alloy include an AlSi alloy.

The metal wires preferably contain Al or an AlSi alloy in view of optical properties, and easiness of a process.

A shape of the metal wire is appropriately selected depending on the intended purpose without any limitation, and examples thereof include a rectangle, a trapezoid. In the case where a shape of the metal wire is a trapezoid, a difference between two parallel bases is appropriately selected depending on the intended purpose without any limitation, but the difference is preferably greater than 0 nm, but 10 nm or less.

The average width of the metal wires is appropriately selected depending on the intended purpose without any limitation, but the average width thereof is preferably 20 nm to 50 nm, more preferably 30 nm to 40 nm, in view of optical properties, and stability of a process.

The average width of the metal wires can be determined, for example, by observing under a scanning electron microscope, or a transmission electron microscope. For example, widths of four metal wires are measured at arbitrary positions, and the average width is determined from the arithmetic mean of the measured values.

The average gap between the metal wires is appropriately selected depending on the intended purpose without any limitation, but the average gap is preferably 80 nm to 200 nm, more preferably 100 nm to 140 nm, in view of easiness of a production, and stability.

The average gap of the metal wires can be determined, for example, by observing under a scanning electron microscope, or a transmission electron microscope. For example, gaps between the metal wires are measured at arbitrary 4 positions, and the average gap is determined from the arithmetic mean of the measured values.

The average thickness of the wire grid layer is appropriately selected depending on the intended purpose without any limitation, but the average thickness thereof is preferably 100 nm to 300 nm in view of optical properties.

The average thickness of the wire grid layer is the average height of the metal wires.

In the present specification, the average thickness is an arithmetic mean of a thickness of a layer in a cross-section cut the metal wire in a direction vertical to the length direction thereof. For example, the average thickness can be determined by observing under a scanning electron microscope or a transmission electron microscope. For example, thickness are measured at arbitrary 10 positions, and the average thickness is determined from the arithmetic mean of the measured values.

Hereinafter, the distance ($D_L$) may be referred to as "$D_L$." It is the same with the distance ($D_R$), the gap ($G_L$), the gap ($G_R$), the region ($R_L$), the region ($R_R$), and the height (H). The distance ($D_R$), the gap ($G_L$), the gap ($G_R$), the region ($R_L$), the region ($R_R$), and the height (H) of the metal wire are explained with reference to FIG. 1, hereinafter.

FIG. 1 is a schematic cross-sectional view illustrating one example of the inorganic polarizing plate of the present invention. The schematic cross-sectional view is a schematic cross-sectional view illustrating a cross-section cut the metal wire in a direction vertical to the length direction thereof.

The inorganic polarizing plate of FIG. 1 contains a substrate 1, a metal oxide layer 2 formed on the substrate 1, and a wire grid layer 3B formed on the metal oxide layer 2. The wire grid layer 3B is formed by aligning a plurality of metal wires.

The height H of the metal wire W is a length from an edge (bottom edge) of the metal wire W at the side of the metal oxide layer 2 to the other edge (top edge) thereof.

In the wire grid layer 3B of FIG. 1, a metal wire $W_L$ is provided left next (in FIG. 1) to a metal wire W, and a metal wire $W_R$ is provided right next (in FIG. 1) to the metal wire W.

The region $R_L$ is a region surrounded with the metal wire W, a metal wire $W_L$, a virtual plane $V_L$ connecting a top of the metal wire W and a top of the metal wire $W_L$, and the metal oxide layer 2.

The region $R_R$ is a region surrounded with the metal wire W, the metal wire $W_R$, a virtual plane $V_R$ connecting a top of the metal wire W and a top of the metal wire $W_R$, and the metal oxide layer 2.

The gap $G_L$ is the minimum distance between a centric position (relative to a height direction) on the center line C of the metal wire W in the width direction, and the center line $C_L$ of the metal wire $W_L$ in the width direction.

The gap $G_R$ is the minimum distance between a centric position (relative to a height direction) on the center line C of the metal wire W in the width direction, and the center line $C_R$ of the metal wire $W_R$ in the width direction.

The distance $D_L$ is a distance between the virtual plane $V_L$ and the metal oxide layer 2 in the region $R_L$. In the case where a cross-section of the region $R_L$ is not a rectangle, the distance $D_L$ is a distance measured to pass through a centric position between the metal wire W and the metal wire $W_L$.

The distance $D_R$ is a distance between the virtual plane $V_R$, and the metal oxide layer 2 in the region $R_R$. In the case where a cross-section of the region $R_R$ is not a rectangle, the distance $D_R$ is a distance measured to pass through a centric position between the metal wire W and the metal wire $W_R$.

Note that, the effective refractive index adjacent to the metal wire relates to a region where an electromagnetic field spreads. Therefore, the concave portion of the metal oxide layer 2 between the metal wires, which is included in a region where the electromagnetic field spreads, is also considered when the distance $D_L$, and the distance $D_R$ are determined. On the other hand, the upper region of the metal wire (the upper region between the metal wire W and the metal wire $W_L$, and the upper region between the metal wire W and the metal wire $W_R$) does not affect the ratio ($S_R/S_L$).

Therefore, the edge of the distance $D_L$ is determined as a virtual plane $V_L$, and the edge of the distance $D_R$ is determined as a virtual plane $V_R$.

<Substrate>

A material, shape, size, and structure of the substrate are appropriately selected depending on the intended purpose without any limitation, provided that the substrate is transparent to light of a bandwidth for use.

The light of a bandwidth for use is appropriately selected depending on the intended purpose without any limitation, and examples thereof include visible light. Examples of the visible light include light in the range of 380 nm to 810 nm.

The phrase "transparent to the light of a bandwidth for use" does not mean that the transmittance is 100%, but the substrate is transparent as long as a resulting inorganic polarizing plate can secure a function as an inorganic polarizing plate.

Examples of the material of the substrate include glass, crystal, and ceramic. Among them, glass is preferable in view of a cost, and transmittance.

The average thickness of the substrate is appropriately selected depending on the intended purpose without any limitation, but the average thickness thereof is preferably 300 μm to 1,000 μm.

<Metal Oxide Layer and Metal Layer>

The metal oxide layer and the metal layer are provided, for example, between the substrate and the wire grid layer, or on a surface of the wire grid layer opposite to the side where the substrate is provided.

Note that, the metal layer is a layer formed by forming a metal into a planar layer, and is different from the wire grid layer in that the metal layer is not in the form of a grid.

The reflectance of the inorganic polarizing plate can be reduced by providing the metal oxide layer, or the metal layer to the inorganic polarizing plate.

The metal oxide layer is preferably a $SiO_2$ layer, because the refractive index thereof is closed to that of glass, it has excellent etching processability, and hence a transmittance can be enhanced.

The average thickness of the metal oxide layer is appropriately selected depending on the intended purpose without any limitation, but the average thickness thereof is preferably 20 nm to 50 nm in view of optical properties.

The average thickness of the metal layer is appropriately selected depending on the intended purpose without any limitation, but the average thickness thereof is preferably 100 nm to 300 nm in view of optical properties.

<Other Members>

The aforementioned other members are appropriately selected depending on the intended purpose without any limitation, and examples thereof include a protective layer, and a water-repellent layer.

<<Protective Layer>>

The protective layer can be provided, for example, in the area where the metal wires are not provided.

A material of the protective layer is appropriately selected depending on the intended purpose without any limitation, and examples thereof include $SiO_2$.

The reliability of the inorganic polarizing plate can be provided by providing the protective layer therein.

<<Water-Repellent Layer>>

The water-repellent layer is provided, for example, on the protective layer.

The water repellency of the inorganic polarizing plate is enhanced, and the reliability thereof can be improved by providing the water-repellent layer therein.

A method for producing the inorganic polarizing plate is appropriately selected depending on the intended purpose without any limitation, but the following production method of an inorganic polarizing plate is preferable, as a wire grid layer having narrow pitches can be formed.

(Production Method of Inorganic Polarizing Plate)

The production method of an inorganic polarizing plate of the present invention contains at least a wire grid layer forming step, and may further contain other steps, as necessary.

<Wire Grid Layer Forming Step>

The wire grid layer forming step is appropriately selected depending on the intended purpose without any limitation, provided that it is a step containing forming a wire grid layer through double patterning using a coverage film. For example, the wire grid layer forming step contains at least a metal layer forming process, a mask layer forming process, a resist pattern forming process, a coverage film forming process, a coverage film etching process, a resist ashing process, a mask layer etching process, a metal layer etching process, and a mask layer removing process, and may further contain other processes, such as an anti-reflection layer forming process, as necessary.

<<Metal Layer Forming Process>>

The metal layer forming process is appropriately selected depending on the intended purpose without any limitation, provided that it is a process containing forming a metal layer on a substrate. Examples thereof include vacuum deposition. The metal layer is processed into a wire grid layer by the wire grid layer forming step. A material of the metal layer is appropriately selected depending on the intended purpose without any limitation, and examples thereof include Al, and an Al alloy. Examples of the Al alloy include an AlSi alloy.

The metal oxide layer (e.g., a $SiO_2$ layer) may be formed on the substrate, on which the metal layer forming process is performed.

<<Mask Layer Forming Process>>

The mask layer forming process is appropriately selected depending on the intended purpose without any limitation, provided that it is a process containing forming a mask layer on the metal layer. Examples thereof include vacuum deposition.

A material of the mask layer is appropriately selected depending on the intended purpose without any limitation, and examples thereof include a multi-layer structure containing $SiO_2$ at least a part thereof.

<<Resist Pattern Forming Process>>

The resist pattern forming process is appropriately selected depending on the intended purpose without any limitation, provided that it is a process containing forming a resist pattern on the mask layer.

The lines of the resist pattern have the similar width to that of the metal wire of the wire grid layer formed by the wire grid layer forming step, and the spaces of the resist pattern are each about twice the gap between two adjacent metal wires formed by the wire grid layer forming step.

<<Coverage Film Forming Process>>

The coverage film forming process is appropriately selected depending on the intended purpose without any limitation, provided that it is a process containing forming a coverage film on the resist pattern formed by the resist pattern forming process, and the exposed mask layer between the resist pattern. The coverage film forming process is preferably atomic layer deposition, or chemical vapor deposition in view of coatability.

The coverage film is appropriately selected depending on the intended purpose without any limitation, but the coverage film is preferably an $Al_2O_3$ film, or a $SiO_2$ film, in view of film formability, and etching processability.

<<Coverage Film Etching Process>>

The coverage film etching process is appropriately selected depending on the intended purpose without any limitation, provided that it is a process containing anisotropically etching the coverage film to expose the tops of the resist pattern and the mask layer, with remaining the coverage film on the side surfaces of the resist pattern. For example, the coverage film etching process can be performed by dry etching.

<<Resist Ashing Process>>

The resist ashing process is appropriately selected depending on the intended purpose without any limitation, provided that it is a process containing removing the resist pattern after the coverage film etching process. For example, the resist ashing process can be performed with oxygen plasma.

<<Mask Layer Etching Process>>

The mask layer etching process is appropriately selected depending on the intended purpose without any limitation, provided that it is a process containing etching the exposed mask layer after the resist ashing process, using the coverage film remained after the coverage film etching process as a mask. For example, the mask layer etching process can be performed by dry etching.

<<Metal Layer Etching Process>>

The metal layer etching process is appropriately selected depending on the intended purpose without any limitation, provided that it is a process containing etching the metal layer after the mask layer etching process, using the mask layer remained after the mask layer etching process, as a mask. In the case where a material of the metal layer is Al, for example, the metal layer etching process can be performed by dry etching using a chlorine gas.

<<Mask Layer Removing Process>>

The mask layer removing process is appropriately selected depending on the intended purpose without any limitation, provided that it is a process containing removing the mask layer remained after the metal layer etching process. For example, the mask layer removing process can be performed by dry etching.

<<Other Processes>>

Examples of the aforementioned other processes include an anti-reflection layer forming process.

—Anti-Reflection Layer Forming Process—

The anti-reflection layer forming process is appropriately selected depending on the intended purpose without any limitation, provided that it is a process, which is performed after the mask layer forming process but before the resist pattern forming process, and contains forming an anti-reflection layer on the mask layer. For example, the anti-reflection layer forming process can be performed by spin coating.

Reflections of exposure light on the metal layer can be prevented by forming the anti-reflection layer on the mask layer, at the time when resist pattern forming process is performed. Therefore, a desired resist pattern can be easily formed.

One example of a method for producing the inorganic polarizing plate through double patterning using a coverage film is explained with reference to FIGS. FIG. 2A to 2J, hereinafter.

FIGS. 2A to 2J are schematic cross-sectional views explaining one example of a step where a wire grid layer is formed through double patterning using a coverage film.

Figure 2A:
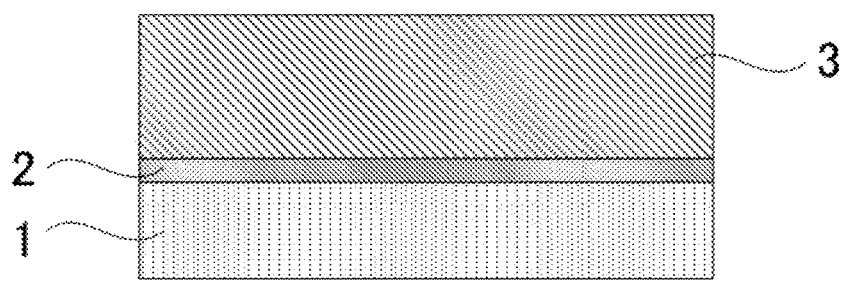
FIG. 2A is a schematic cross-sectional view explaining one example of a step where a wire grid layer is formed through double patterning using a coverage film (part 1).

First, a meal layer 3 is formed on a substrate 1, to which a metal oxide layer 2 has been formed (FIG. 2A).

Figure 2B:
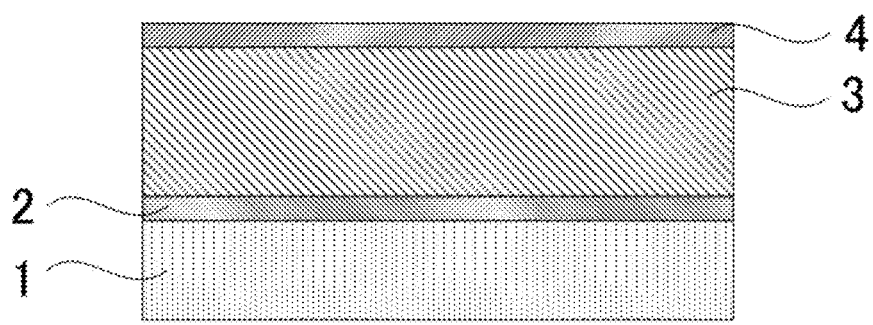
FIG. 2B is a schematic cross-sectional view explaining one example of a step where a wire grid layer is formed through double patterning using a coverage film (part 2).

Subsequently, a mask layer 4 is formed on the metal layer 3 (FIG. 2B).

Next, a resist film 5 is formed on the mask layer 4 (FIG. 2C).

Then, the resist film 5 is patterned by photolithography, to thereby form a resist pattern 5A on the mask layer 4 (FIG. 2D).

Figure 2E:
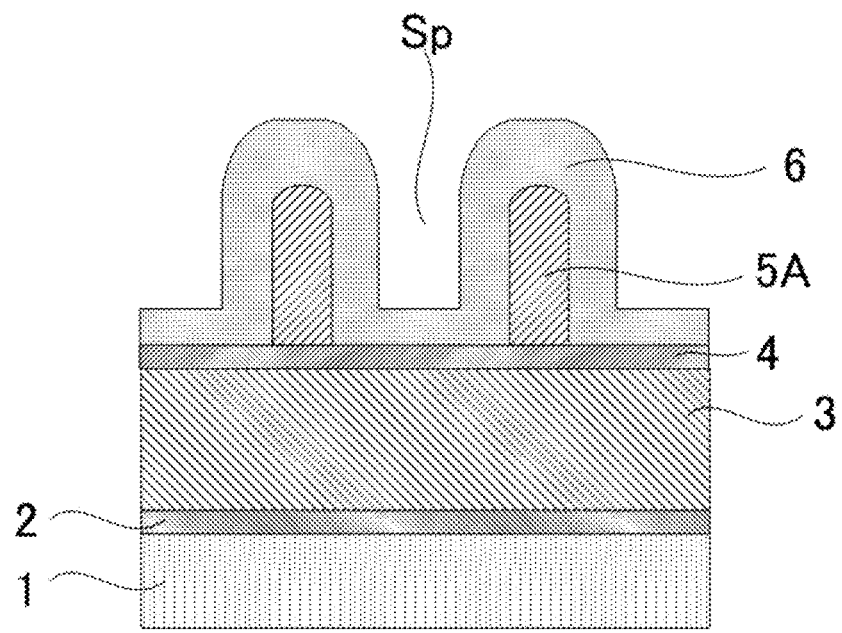
FIG. 2E is a schematic cross-sectional view explaining one example of a step where a wire grid layer is formed through double patterning using a coverage film (part 5).

Subsequently, a coverage film 6 is formed on the resist pattern 5A and the exposed mask layer 4 to correspond to the shapes thereof (FIG. 2E). Note that, the coverage film 6 is formed in a manner that space Sp, in which the coverage film 6 is not filled, is formed between the resist pattern 5A.

Figure 2F:
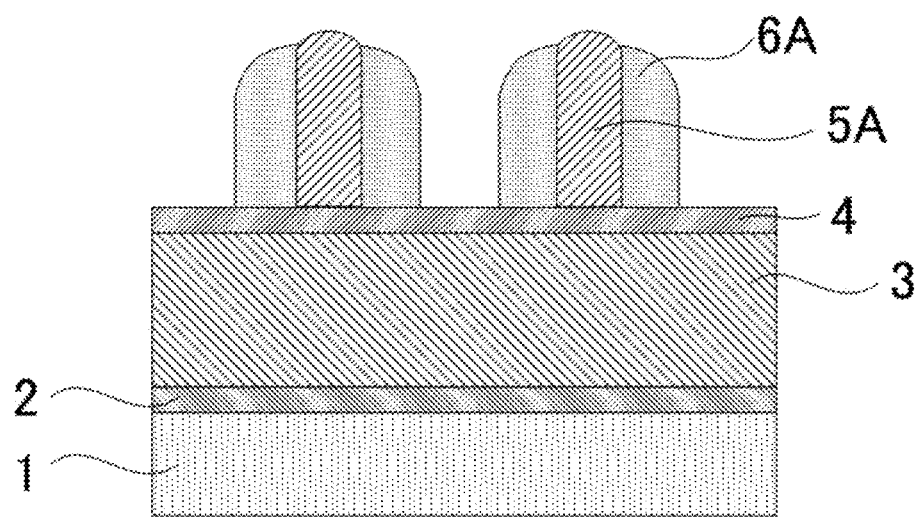
FIG. 2F is a schematic cross-sectional view explaining one example of a step where a wire grid layer is formed through double patterning using a coverage film (part 6).

Next, anisotropic etching is performed to selectively remove the coverage film 6 on the tops of the resist pattern 5A and the mask layer 4, to thereby obtain a coverage film pattern 6A (FIG. 2F).

Figure 2G:
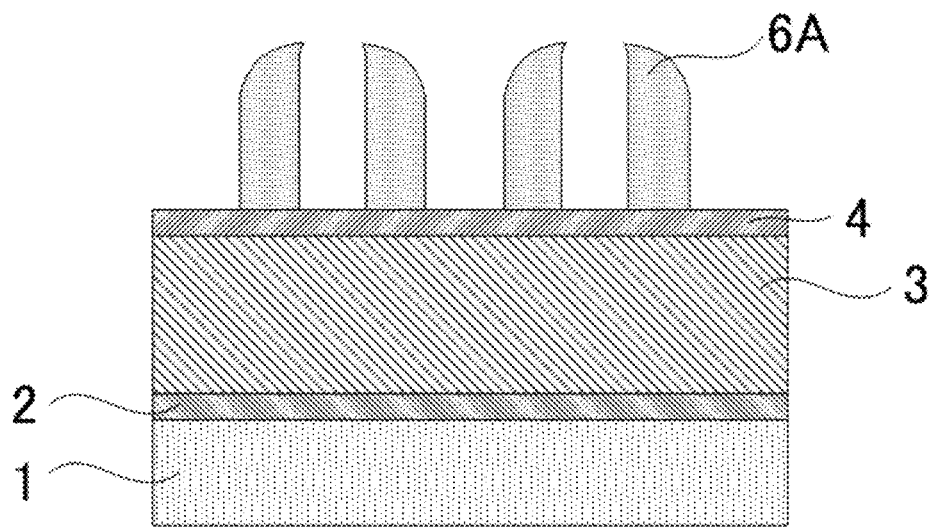
FIG. 2G is a schematic cross-sectional view explaining one example of a step where a wire grid layer is formed through double patterning using a coverage film (part 7).

Subsequently, resist ashing is performed to remove the resist pattern 5A (FIG. 2G). As a result, only the coverage film pattern 6A is remained on the mask layer 4.

Figure 2H:
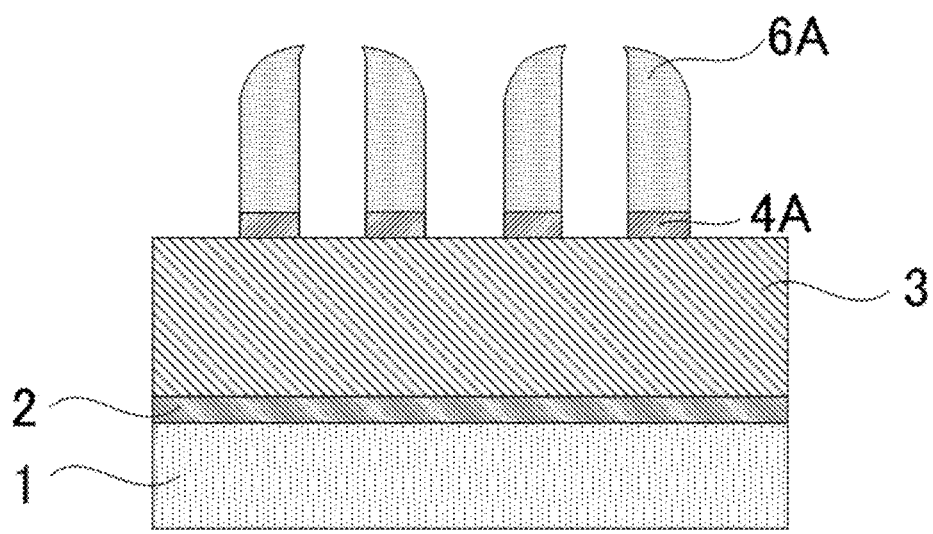
FIG. 2H is a schematic cross-sectional view explaining one example of a step where a wire grid layer is formed through double patterning using a coverage film (part 8).

Next, etching is performed on the mask layer 4 using the coverage film pattern 6A as a mask, to thereby obtain a mask layer pattern 4A (FIG. 2H).

Figure 2I:
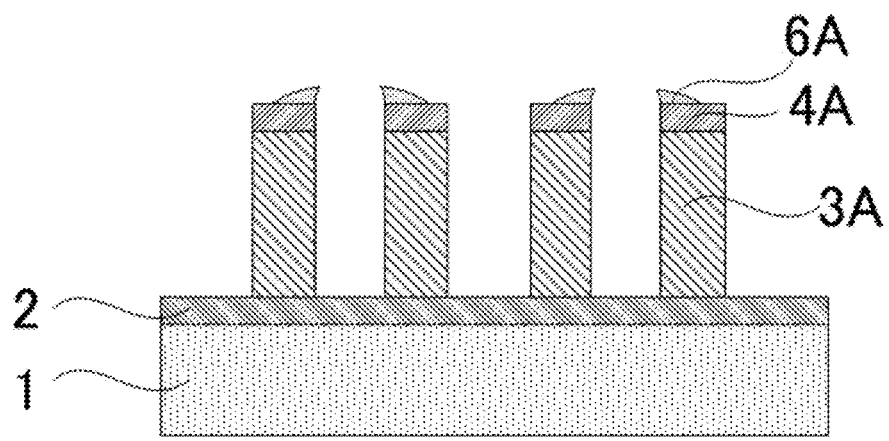
FIG. 2I is a schematic cross-sectional view explaining one example of a step where a wire grid layer is formed through double patterning using a coverage film (part 9).

Then, etching is performed on the metal layer 3 using the mask layer pattern 4A as a mask, to thereby obtain a metal wire 3A (FIG. 2I).

Figure 2J:
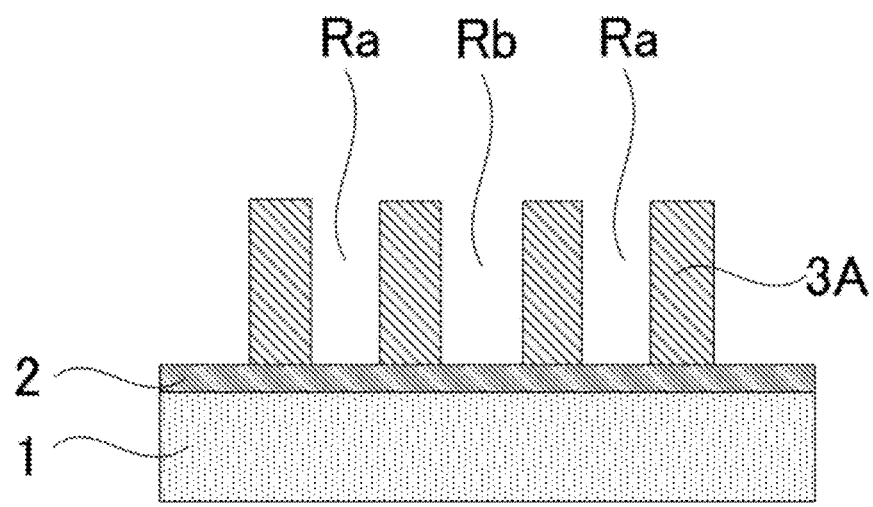
FIG. 2J is a schematic cross-sectional view explaining one example of a step where a wire grid layer is formed through double patterning using a coverage film (part 10).

Next, the mask layer pattern 4A remained on the metal wire 3A is removed (FIG. 2J).

In a manner as described above, the wire grid layer is formed through double patterning using a coverage film. Note that, in the double patterning, the region Ra and the region Rb illustrated in FIG. 2J have different environments when they are formed. Specifically, the region Ra is a region formed based on the resist pattern 5A, and the region Rb is a region formed based on a space Sp between the resist pattern when the coverage film 6 is formed. Therefore, heights (distance along the thickness direction of the substrate) and widths of the region Ra and the region Rb may be different because of the difference in the environment of each process in the wire grid layer forming step. For example, etching is performed even on the metal oxide layer 2 in the region Ra, and the region Rb, and the etching depth may be different. Specifically, the regions present both sides of the metal wire 3A may be asymmetric. In such a case, the Rayleigh resonance may be caused by the aforementioned asymmetry. The inorganic polarizing plate can suppress the Rayleigh resonance, and prevents reduction in transmission properties.

Examples

Examples of the present invention are explained hereinafter, but these examples shall not be construed as to limit the scope of the present invention.

An electromagnetic field simulation was performed by rigorous coupled wave analysis (RCWA) using a grating analysis simulator, Gsolver, of Grating Solver Development Co.

(Simulation 1)

A change in the transmittance caused by varying a difference between the gap ($G_L$) and the gap ($G_R$) was confirmed. Specifically, a change in the transmittance was simulated by varying a gap between a metal wire (W) and a metal wire ($W_L$), and a gap between a metal wire (W) and a metal wire ($W_R$), which were formed of aluminium.

Figure 3A:
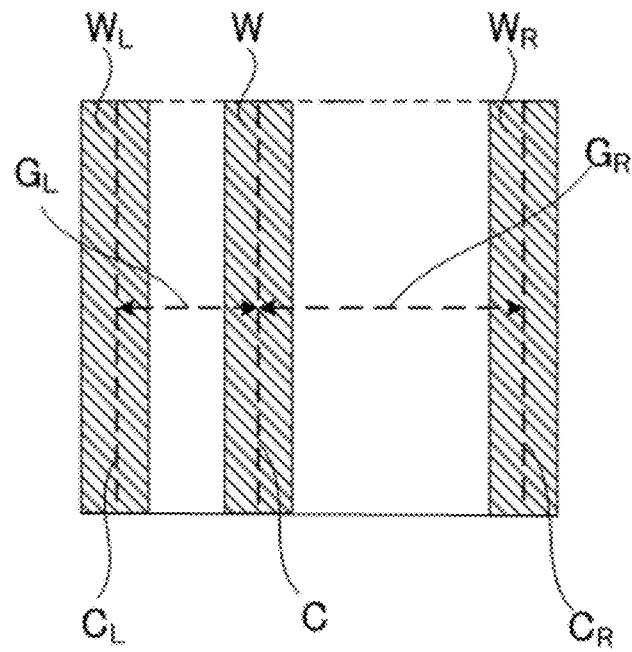
FIG. 3A is a schematic cross-sectional view illustrating a structure of the wire grid layer used for Simulation 1.

A schematic cross-sectional view of a structure of the wire grid layer used for the simulation is presented in FIG. 3A. The conditions and the transmittance dip (reduction in the transmittance) are presented below.

TABLE 1-1

|  | Metal wire ($W_L$) | Metal wire (W) | Metal wire ($W_R$) |
|---|---|---|---|
| Height (H) (nm) | 144 | 144 | 144 |
| Width (nm) | 35 | 35 | 35 |

TABLE 1-2

|  | nm |
|---|---|
| Distance ($D_L$) | 144 |
| Gap ($G_L$) | Varied |
| Distance ($D_R$) | 144 |
| Gap ($G_R$) | Varied |

TABLE 1-3

|  | Gap ($G_L/G_R$) | Distance ($D_L/D_R$) | $S_L$ ($D_L/G_L$) | $S_R$ ($D_R/G_R$) | Ratio $S_R/S_L = S$ | Transmittance dip |
|---|---|---|---|---|---|---|
| (a) | 100 nm/ 100 nm | 144 nm/ 144 nm | 1.44 | 1.44 | 1.00 | 0.0% |
| (b) | 100 nm/ 90 nm | 144 nm/ 144 nm | 1.44 | 1.60 | 1.11 | 0.5% |
| (c) | 120 nm/ 80 nm | 144 nm/ 144 nm | 1.20 | 1.80 | 1.50 | 2.0% |
| (d) | 130 nm/ 70 nm | 144 nm/ 144 nm | 1.11 | 2.06 | 1.86 | 4.1% |

Figure 3B:
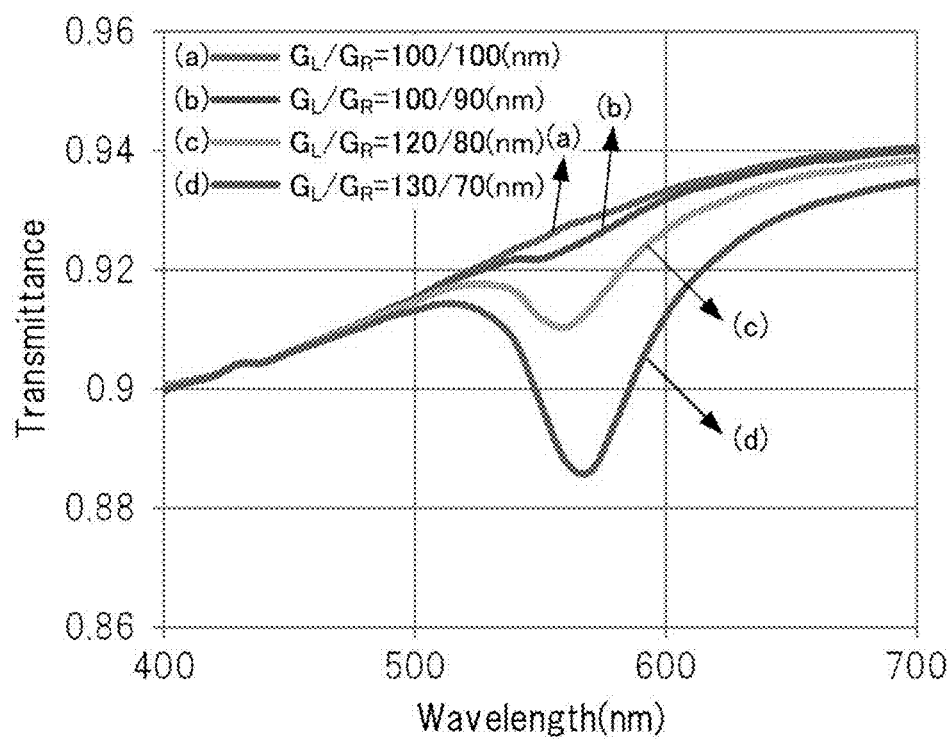
FIG. 3B is a graph depicting transmittance in Simulation 1.

A graph depicting the transmittance by the simulation is presented in FIG. 3B.

As the difference between the gap ($G_R$) and the gap ($G_L$) increased, a notch of the wavelength-transmittance curve due to the resonance increased, and the reduction in the transmittance was observed.

It was confirmed that the difference between the gap ($G_R$) and the gap ($G_L$) was preferably 10 nm or less in order to make the reduction in the transmittance 0.5% or less.

(Simulation 2)

A change in the transmittance was confirmed by varying a difference between the gap ($G_L$) and the gap ($G_R$), with maintaining the distance ($D_L$) and the distance ($D_R$) to 8 mm. Specifically, a change in the transmittance was simulated by forming a $SiO_2$ layer as an under layer below metal wires (W) and ($W_L$) formed of aluminium, making a distance ($D_L$) than a distance ($D_R$) by 8 nm, and varying a gap between the metal wires (W) and ($W_L$), and a gap between the metal wires (W) and ($W_R$).

Figure 4A:
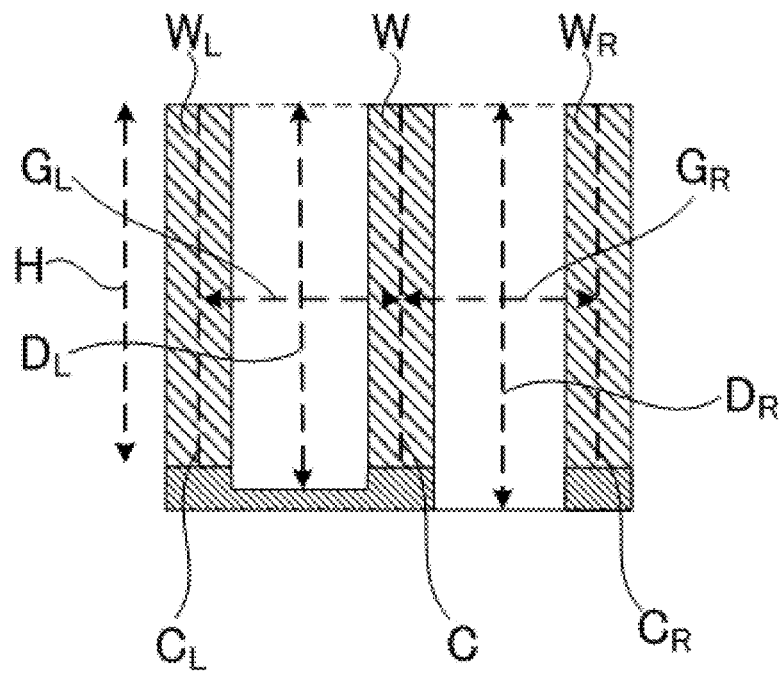
FIG. 4A is a schematic cross-sectional view illustrating a structure of the wire grid layer used for Simulation 2.

A schematic cross-sectional view of a structure of the wire grid layer used for the simulation is presented in FIG. 4A. The conditions and the transmittance dip (reduction in the transmittance) are presented below.

TABLE 2-1

|  | Metal wire ($W_L$) | Metal wire (W) | Metal wire ($W_R$) |
|---|---|---|---|
| Height (H) (nm) | 144 | 144 | 144 |
| Width (nm) | 35 | 35 | 35 |

TABLE 2-2

| | nm |
|---|---|
| Distance ($D_L$) | 152 |
| Gap ($G_L$) | Varied |
| Distance ($D_R$) | 160 |
| Gap ($G_R$) | Varied |

TABLE 2-3

| | Gap ($G_L/G_R$) | Distance ($D_L/D_R$) | $S_L$ ($D_L/G_L$) | $S_R$ ($D_R/G_R$) | Ratio $S_R/S_L$ = S | Transmittance dip |
|---|---|---|---|---|---|---|
| (a) | 90 nm/ 110 nm | 152 nm/ 160 nm | 1.69 | 1.45 | 0.86 | 1.1 |
| (b) | 100 nm/ 100 nm | 152 nm/ 160 nm | 1.52 | 1.60 | 1.05 | 0.2 |
| (c) | 110 nm/ 90 nm | 152 nm/ 160 nm | 1.38 | 1.78 | 1.29 | 0.2 |
| (d) | 120 nm/ 80 nm | 152 nm/ 160 nm | 1.27 | 2.00 | 1.58 | 1.0 |

Figure 4B:
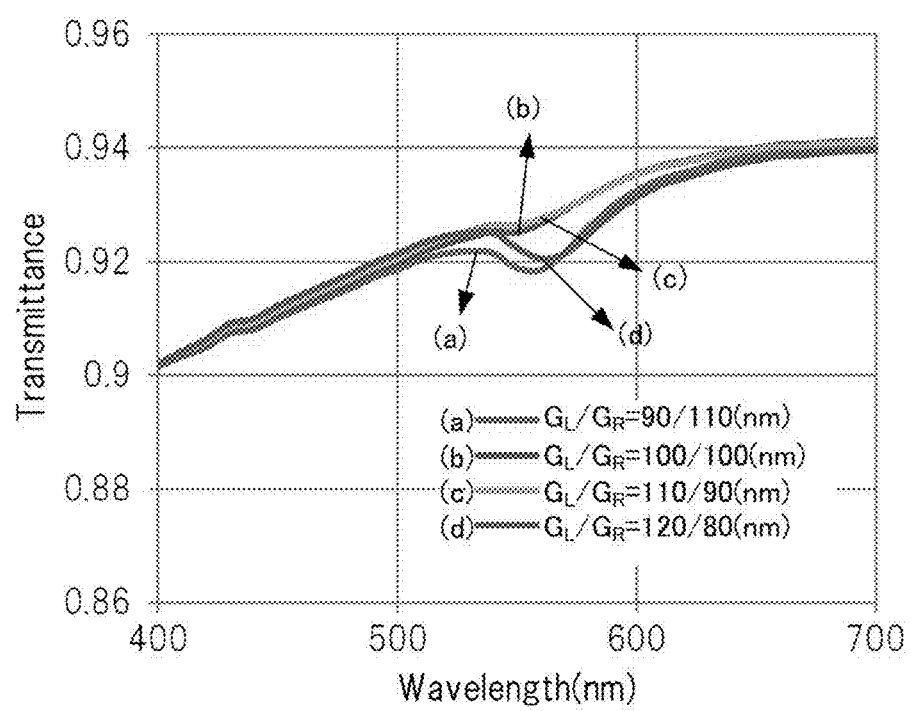
FIG. 4B is a graph depicting transmittance in Simulation 2.

A graph depicting the transmittance by the simulation is presented in FIG. 4B.

Even in the case of 0<($D_R$−$D_L$) and |$G_R$−$G_L$|≠0, the reduction in the transmittance was maintained to 0.5% or less by satisfying the formula (3).

Note that, in the case where a difference between the distance ($D_L$) and the distance ($D_R$) was 8 nm, the reduction in the transmittance was 0.2% or less, which was extremely excellent, in the range where the formula (3) was satisfied, and the formula (2-2) [0 nm<|$G_L$−$G_R$|≤20 nm] was satisfied.

It was confirmed from the results of Simulations 1 to 2 that a simplified asymmetric degree based on the concept of the effective refractive index was related to the transmittance dip, and the transmittance dip (reduction in the transmittance) could be prevented by satisfying the formula (3) even when the wire grid had an asymmetric structure.

This application claims priority to Japanese application No. 2014-101635, filed on May 15, 2014 and incorporated herein by reference.

What is claimed is:

1. An inorganic polarizing plate, comprising:
a substrate, which is transparent to light of a bandwidth for use;
a wire grid layer containing a plurality of metal wires aligned on the substrate with gaps shorter than a wavelength of the light, and
a metal oxide layer provided between the wire grid layer and the substrate,
wherein the inorganic polarizing plate satisfies the following formulae (1) to (3):

0 nm<($D_R$−$D_L$)  Formula (1)

0 nm<|$G_R$−$G_L$|  Formula (2)

0.90≤$S_R/S_L$≤1.30  Formula (3)

where $D_L$ is a distance along a thickness direction of the substrate in a region $R_L$ between one metal wire W and a metal wire $W_L$ provided next to the metal wire W in the wire grid layer, and $D_R$ is a distance along the thickness direction of the substrate in a region $R_R$ between the metal wire W and a metal wire $W_R$ provided next to the metal wire W and at an opposite side to a side where the metal wire $W_L$ is provided, where the region $R_L$ is a region between the metal wire W and the metal wire $W_L$ provided next to the metal wire W in the wire grid layer, and the region $R_R$ is a region between the metal wire W and the metal wire $W_R$ provided next to the metal wire W in the wire grid layer,
where $G_L$ is a gap between the metal wire W and the metal wire $W_L$, and $G_R$ is a gap between the metal wire W and the metal wire $W_R$, and
where $S_L$ is a ratio of the distance $D_L$ to the gap $G_L$, and $S_R$ is a ratio of the distance $D_R$ to the gap $G_R$; and
wherein Formula (1) is based on a difference between a thickness of the metal oxide layer between the region $R_R$ and the substrate, and a thickness of the metal oxide layer between the region $R_L$ and the substrate.

2. The inorganic polarizing plate according to claim 1, wherein the substrate is glass.

3. The inorganic polarizing plate according to claim 1, wherein the metal wire contains Al or an AlSi alloy.

4. A production method of an inorganic polarizing plate, comprising:
forming a wire grid layer through double patterning using a coverage film,
wherein the production method is a method for producing the inorganic polarizing plate according to claim 1.

5. The production method according to claim 4, wherein the coverage film used for the double patterning is an $Al_2O_3$ film.

6. The production method according to claim 4, wherein the coverage film used for the double patterning is formed by atomic layer deposition or chemical vapor deposition.

7. The inorganic polarizing plate according to claim 1, wherein the distance $D_L$ and the distance $D_R$ satisfy the following formula (1-2), and the gap $G_L$ and the gap $G_R$ satisfy the following formula (2-2):

0 nm<($D_R$−$D_L$)≤8 nm  Formula (1-2); and 0 nm<|$G_R$−$G_L$|≤20 nm  Formula (2-2).

8. The inorganic polarizing plate according to claim 1, wherein an average gap between the metal wires being 100 nm to 200 nm.

9. The inorganic polarizing plate according to claim 1, wherein the inorganic polarizing plate reduces transmittance caused by asymmetry of the region $R_L$ and the region $R_R$ by 0.5% or less.

10. The inorganic polarizing plate according to claim 1, wherein the metal oxide layer is a $SiO_2$ layer.

* * * * *